US012646574B2

(12) United States Patent
Murayama et al.

(10) Patent No.: US 12,646,574 B2
(45) Date of Patent: Jun. 2, 2026

(54) SEMICONDUCTOR MEMORY DEVICE

(71) Applicant: Kioxia Corporation, Tokyo (JP)

(72) Inventors: Akiyuki Murayama, Koto (JP);
Yusuke Arayashiki, Kawasaki (JP);
Tsuyoshi Ogikubo, Yokohama (JP);
Suzuka Kajiwara, Kamakura (JP);
Motohiko Fujimatsu, Shinagawa (JP);
Katsuya Nishiyama, Yokohama (JP);
Kikuko Sugimae, Yokohama (JP)

(73) Assignee: Kioxia Corporation, Tokyo (JP)

( * ) Notice: Subject to any disclaimer, the term of this patent is extended or adjusted under 35 U.S.C. 154(b) by 116 days.

(21) Appl. No.: 18/814,679

(22) Filed: Aug. 26, 2024

(65) Prior Publication Data

US 2025/0124989 A1 Apr. 17, 2025

(30) Foreign Application Priority Data

Oct. 16, 2023 (JP) ................................. 2023-178049

(51) Int. Cl.
| | |
|---|---|
| *G11C 16/34* | (2006.01) |
| *G11C 16/04* | (2006.01) |
| *G11C 16/10* | (2006.01) |
| *G11C 16/16* | (2006.01) |

(52) U.S. Cl.
CPC ...... *G11C 16/3427* (2013.01); *G11C 16/0483* (2013.01); *G11C 16/10* (2013.01); *G11C 16/16* (2013.01)

(58) Field of Classification Search
CPC . G11C 16/3427; G11C 16/0483; G11C 16/10; G11C 16/16; G11C 16/08
USPC ...................................................... 365/185.02
See application file for complete search history.

(56) References Cited

U.S. PATENT DOCUMENTS

| | | | |
|---|---|---|---|
| 8,654,580 B2 | 2/2014 | Kang et al. | |
| 2012/0307561 A1 | 12/2012 | Joo et al. | |
| 2025/0095744 A1* | 3/2025 | Cui ....................... | G11C 16/102 |

FOREIGN PATENT DOCUMENTS

| | | |
|---|---|---|
| JP | 2012-252775 A | 12/2012 |
| JP | 5951253 B2 | 7/2016 |

* cited by examiner

*Primary Examiner* — Fernando Hidalgo
(74) *Attorney, Agent, or Firm* — Oblon, McClelland, Maier & Neustadt, L.L.P.

(57) ABSTRACT

A semiconductor memory device includes: a memory cell array including a plurality of bit lines, a source line, a plurality of NAND strings, a first and a second sub block, a first word line group included in the first sub block, a second word line group included in the second sub block, and a dummy word line located between the first and second sub blocks; and a control circuit capable of applying predetermined voltages to the first word line group, the second word line group, and the dummy word line. When a specific word line belonging to the first word line group is selected for the execution of a write operation, a voltage higher than voltages applied to an unselected word line belonging to the first word line group and the second word line group is applied to the dummy word line.

5 Claims, 13 Drawing Sheets

FIG.3

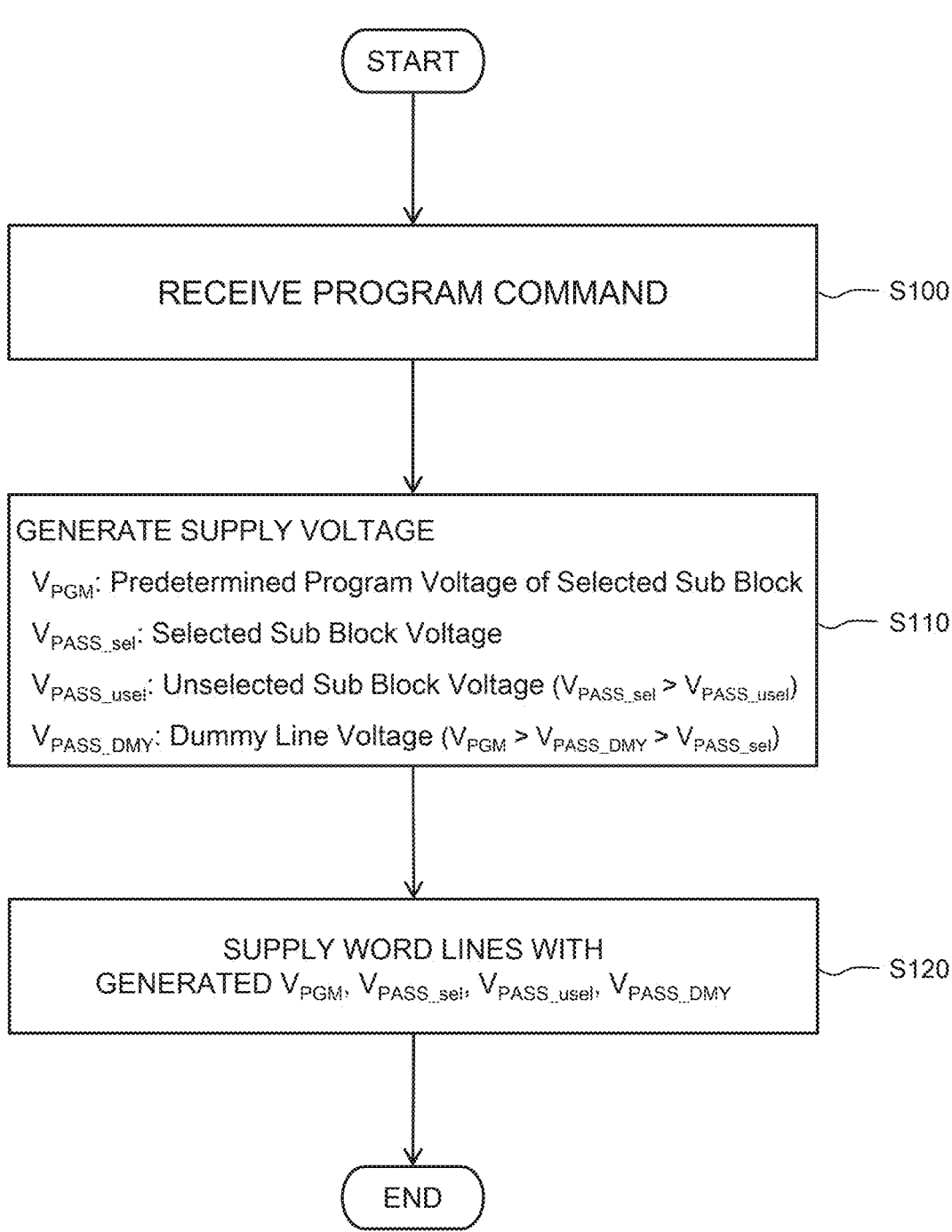

START

RECEIVE PROGRAM COMMAND — S100

GENERATE SUPPLY VOLTAGE $V_{PGM}$: Predetermined Program Voltage of Selected Sub Block $V_{PASS\_sel}$: Selected Sub Block Voltage $V_{PASS\_usel}$: Unselected Sub Block Voltage ($V_{PASS\_sel} > V_{PASS\_usel}$)

$V_{PASS\_DMY}$: Dummy Line Voltage ($V_{PGM} > V_{PASS\_DMY} > V_{PASS\_sel}$)

— S110

SUPPLY WORD LINES WITH
GENERATED $V_{PGM}$, $V_{PASS\_sel}$, $V_{PASS\_usel}$, $V_{PASS\_DMY}$ — S120

END

SEMICONDUCTOR MEMORY DEVICE

CROSS REFERENCE TO RELATED APPLICATIONS

This application is based upon and claims the benefit of priority from Japanese Patent Application No. 2023-178049, filed on Oct. 16, 2023; the entire contents of which are incorporated herein by reference.

FIELD

Embodiments relate to a semiconductor memory device.

BACKGROUND

In a semiconductor memory device such as 3D-NAND, the number of layers (layer number) of word lines (group) forming gates of memory transistors has been increasing. Accordingly, the block size of the semiconductor memory device has been increasing. This implies an increase in loads (for example, power consumption, system block ratio, and so on) to a user using the semiconductor memory device.

This has given rise to an increased demand for SBM (Sub Block Mode) where a single block is divided and the resultant sub blocks are independently handled. In the sub block mode, a sub block to which a word line for program execution belongs is called a "selected sub block (SB_sel)", and a sub block to which the word line for program execution does not belong is called an "unselected sub block (SB_usel)". It is possible to independently manage the selected sub block and the unselected sub block.

In the sub block mode, it is known that, when the program is executed on the word line in the selected sub block, there occurs a miswrite (Disturb) caused by a voltage $V_{PASS\_usel}$ applied to word lines belonging to the same physical block and belonging to the unselected sub block. Specifically, repeating erase and write from/to the selected sub block while retaining data in the unselected sub block results in the accumulation of the miswrites (accumulation of electrical charges) caused by the voltage $V_{PASS\_usel}$ applied to the unselected sub block.

BRIEF DESCRIPTION OF THE DRAWINGS

FIG. 3 is a flowchart illustrating an example of the operation of the semiconductor memory device according to the first embodiment.

DETAILED DESCRIPTION

Figure 1:
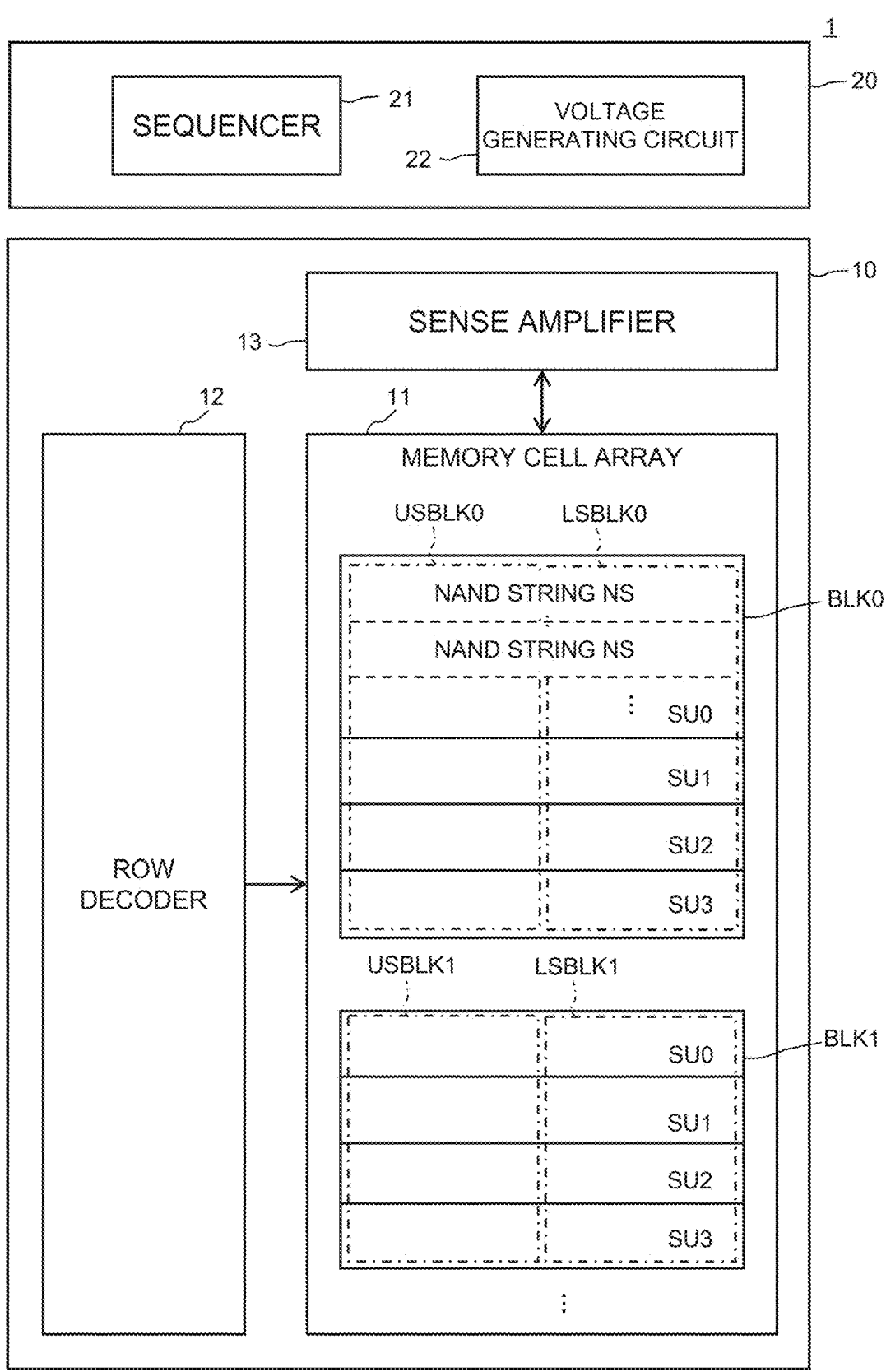
FIG. 1 is a block diagram illustrating the hardware configuration of a semiconductor memory device according to a first embodiment.

By applying, to word lines belonging to an unselected sub block, a voltage lower than a voltage applied to word lines belonging to a selected sub block and different from a word line involved in a program, it is possible to inhibit a miswrite to the unselected sub block. On the other hand, if a potential difference between a voltage applied to the word line belonging to the selected sub block and involved in the program and the voltage applied to the word lines belonging to the unselected sub block is large, there occurs a phenomenon of electron movement from the unselected sub block to the selected sub block (Source Side Injection: SSI).

A described above, a conventional semiconductor memory device has a problem that, if a program to the selected sub block is repeated while data in the unselected sub block is retained in the sub block mode, miswrites to the unselected sub block accumulate. Further, controlling the voltage applied to the word lines belonging to the unselected sub block to solve this problem involves the problem of the SSI occurrence. Embodiments provide a semiconductor memory device capable of inhibiting the occurrence of SSI while inhibiting the accumulation of miswrites to an unselected sub block in a sub block mode.

An embodiment is a semiconductor memory device including: a memory cell array including a plurality of bit lines, a source line, a plurality of NAND strings each having a plurality of serially connected memory cell transistors and connecting the plurality of bit lines and the source line, a first sub block and a second sub block different from the first sub block, the first and second sub blocks sharing the plurality of bit lines, the plurality of NAND strings, and the source line as series current paths, a first word line group included in the first sub block, a second word line group included in the second sub block; and a dummy word line located between the first sub block and the second sub block; and a control circuit capable of applying predetermined voltages to the first word line group, the second word line group, and the dummy word line. When selecting a specific word line belonging to the first word line group to execute a write operation, the control circuit applies, to the dummy word line, a voltage higher than a voltage applied to an unselected word line belonging to the first word line group and a voltage applied to the second word line group.

First Embodiment

Embodiments will be hereinafter described in detail with reference to the drawings. In the following description, constituent elements having substantially the same function and configuration will be denoted by the same reference sign, and a redundant description thereof will be omitted. The embodiments below only exemplify devices and methods for embodying the technical idea of the embodiment, and the technical idea of the embodiment is not intended to limit the materials, shapes, structures, arrangements, and so on of constituent components to those described below. Various changes may be made in the technical idea of the embodiments within the scope of the claims.

Figure 2:
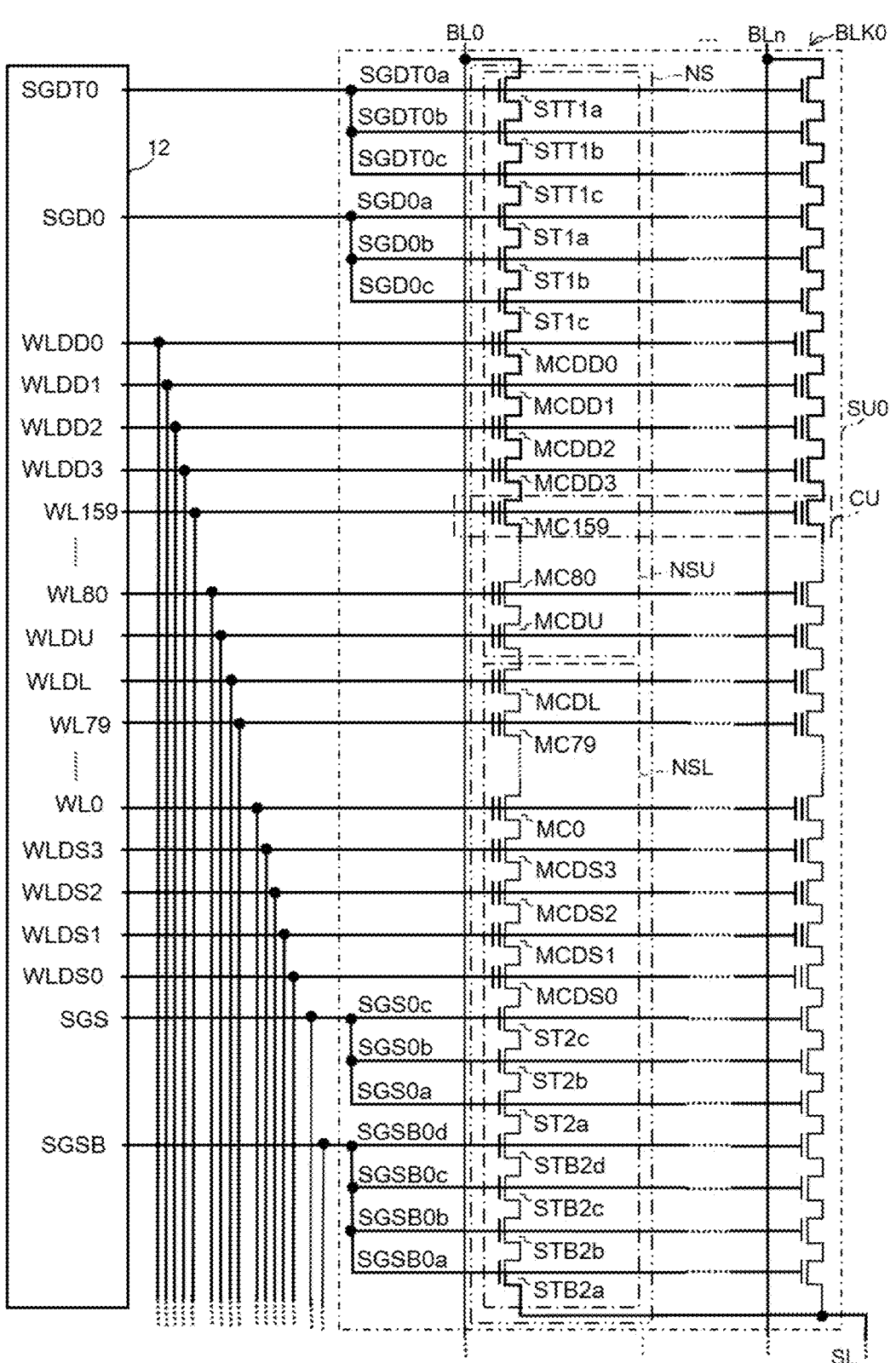
FIG. 2 is a circuit diagram illustrating the configuration of a block in a memory cell array according to the first embodiment.

FIG. 1 is a block diagram illustrating the hardware configuration of a semiconductor memory device according to a first embodiment. FIG. 2 is a circuit diagram illustrating the configuration of a block in a memory cell array according to the first embodiment. The semiconductor memory device 1 illustrated in FIG. 1 and FIG. 2 is an example of a three-dimensional stacked NAND flash memory in which memory cell transistors are stacked three-dimensionally on a semiconductor substrate.

As illustrated in FIG. 1, the semiconductor memory device 1 includes a memory core 10 and a peripheral circuit 20.

The memory core 10 is a storage medium in the semiconductor memory device 1. The memory core 10 includes a memory cell array 11, a row decoder 12, and a sense amplifier 13.

The memory cell array 11 is a collection of memory transistors. The memory cell array 11 includes a plurality of blocks BLK (BLK0, BLK1, . . . ).

The blocks BLK each include a plurality of string units SU (in the example in FIG. 1, string units SU0 to SU3). The string units SU are each a collection of NAND strings NS in which the plurality of memory cell transistors are connected in series. The block BLK is a data erasable unit, for instance. That is, data retained by the memory cell transistors included in the block BLK are erasable in bulk.

In the semiconductor memory device 1 of this embodiment, the blocks BLK are each divided into a plurality of sub blocks SBLK. In each of the sub blocks SBLK, erase can be done independently. As illustrated in FIG. 1, the NAND strings NS in the block BLK are each divided according to the number of the sub blocks SBLK. The divided NAND strings NS are included in different sub blocks SBLK respectively. In the example illustrated in FIG. 1, the number of the sub blocks SBLK included in the block BLK is two. In the description below, the two sub blocks SBLK will be represented by an "upper sub block USBLK" and a "lower sub block LSBLK".

As illustrated in FIG. 1, the block BLK0 includes an upper sub block USBLK0 and a lower sub block LSBLK0. The block BLK1 includes an upper sub block USBLK1 and a lower sub block LSBLK1. It should be noted that the number of the blocks BLK in the memory cell array 11, the number of the sub blocks SBLK, the number of the string units SU in each of the blocks BLK, and the number of the NAND strings NS in each of the string units SU may be any.

The row decoder 12 is a circuit that decodes a row address received from a not-illustrated external controller. The row decoder 12 has a function of selecting a row-direction line of the memory cell array 11 based on the decoding result.

More specifically, the row decoder 12 gives voltages to various lines (word lines (group), dummy word lines (group), and select gate lines (group)) for row-direction selection.

The sense amplifier 13 is a circuit that detects data from the memory cell array 11 and gives predetermined voltages to the memory cell array 11. The sense amplifier 13 has a function of sensing data read from one of the blocks BLK, through a bit line at the time of data read. The sense amplifier 13 also has a function of giving a voltage corresponding to write data to the memory cell array 11 through a bit line at the time of data write.

The peripheral circuit 20 includes a sequencer 21 and a voltage generating circuit 22.

The sequencer 21 is a control circuit that controls the whole operation of the semiconductor memory device 1. The sequencer 21 has a function of controlling the voltage generating circuit 22, the row decoder 12, the sense amplifier 13, and so on at the time of a write operation, a read operation, and an erase operation.

The voltage generating circuit 22 is a circuit that generates voltages used for the write operation, the read operation, and the erase operation. The voltage generating circuit 22 has a function of supplying the generated voltages to the memory cell array 11, the row decoder 12, the sense amplifier 13, and so on.

Next, the configuration of the memory cell array 11 will be described in detail with reference to FIG. 2. FIG. 2 is an example of a circuit of the string unit SU0 of the block BLK0. The other blocks BLK and string units SU have the same configurations.

As illustrated in FIG. 2, the string unit SU0 of the block BLK0 includes the plurality of NAND strings NS. In the example illustrated in FIG. 2, the NAND string NS includes 160 memory cell transistors MC0 to MC159, 10 dummy memory cell transistors MCDD0 to MCDD3, MCDU, MCDL, and MCDS0 to MCDS3, and 13 select transistors STT1a to STT1c, ST1a to ST1c, ST2a to ST2c, and STB2a to STB2d. In the following description, a memory cell transistor out of the memory cell transistors MC0 to MC159 is represented by a memory cell transistor MC unless it is limited to any one of these.

Similarly, a dummy memory cell transistor out of the dummy memory cell transistors MCDD0 to MCDD3 is represented by a dummy memory cell transistor MCDD unless it is limited to any of these. A dummy memory cell transistor out of the dummy memory cell transistors MCDS0 to MCDS3 is represented by a dummy memory cell transistor MCDS unless it is limited to any of these. A dummy memory cell transistor out of the dummy memory cell transistors MCDD, MCDU, MCDL, and MCDS is represented by a dummy memory cell transistor MCD unless it is limited to any of these.

A select transistor out of the select transistors STT1a to STT1c is represented by STT1 unless it is limited to any of these. A select transistor out of the select transistors ST1a to ST1c is represented by ST1 unless it is limited to any of these. A select transistor out of the select transistors ST2a to ST2c is represented by ST2 unless it is limited to any of these. A select transistor out of the select transistors STB2a to STB2d is represented by STB2 unless it is limited to any of these.

The memory cell transistor MC and the dummy memory cell transistor MCD each include a control gate and a charge storage layer. The memory cell transistor MC is capable of nonvolatile data retention. The dummy memory cell transistor MCD, though having the same configuration as that of the memory cell transistor MC, is used as a dummy and is not used for data retention.

It should be noted that the memory cell transistor MC and the dummy memory cell transistor MCD may be of a MONOS type whose charge storage layer is an insulating film or may be of an FG type whose charge storage layer is a conductive layer. Hereinafter, in this embodiment, it is assumed that they are of the MONOS type, for instance. The numbers of the memory cell transistors MC and the dummy memory cell transistors MCD in the NAND string NS may be any. The configuration with no dummy memory cell transistors MCD is also permissible.

The select transistors ST1 and ST2 are used for the selection of the string unit SU (NAND string NS). At the time of a write operation and a read operation, the select transistors STT1 and STB2 are used for the selection of the string unit SU similarly to the select transistors ST1 and ST2. Further, at the time of an erase operation, the select transistors STT1 and STB2 are used for the generation of a GIDL (Gate Induced Drain Leakage) current. The numbers of the select transistors ST1, ST2, STT1, and STB2 may be any as long as the numbers are one or more.

As illustrated in FIG. 2, in the NAND string NS, current paths of the memory cell transistors MC, the dummy memory cell transistors MCD, and the select transistors ST1, ST2, STT1, and STB2 are connected in series. For example, the current paths of the select transistors STB2a to STB2d and ST2a to ST2c, the dummy memory cell transistors MCDS0 to MCDS3, the memory cell transistors MC0 to MC79, the dummy memory cell transistors MCDL and MCDU, the memory cell transistors MC80 to MC159, the dummy memory cell transistors MCDD3 to MCDD0, and the select transistors ST1c to ST1a and STT1c to STT1a are connected in series in the order mentioned.

In this embodiment, the NAND string NS includes a lower string NSL corresponding to the lower sub block LSBLK and an upper string NSU corresponding to the upper sub block USBLK. In the example illustrated in FIG. 2, the lower string NSL includes the memory cell transistors MC0 to MC79, the dummy memory cell transistors MCDS0 to MCDS3 and MCDL, and the select transistors ST2a to ST2c and STB2a to STB2d. The upper string NSU includes the memory cell transistors MC80 to MC159, the dummy memory cell transistors MCDD0 to MCDD3 and MCDU, and the select transistors ST1a to ST1c and STT1a to STT1c.

That is, by an erase operation for the lower sub block LSBLK, data erase of the memory cell transistors MC0 to MC79 in the block BLK is possible. By an erase operation for the upper sub block USBLK, data erase of the memory cell transistors MC80 to MC159 in the block BLK is possible.

The control gates of the memory cell transistors MC0 to MC159 in the block BLK are commonly connected to word lines WL0 to WL159 respectively. The memory cell transistors MC0 of the plurality of NAND strings NS included in the string units SU0 to SU3 in the block BLK0 are commonly connected to the word line WL0. This is also the same with the other memory cell transistors MC.

Further, the control gates of the dummy memory cell transistors MCDD0 to MCDD3, MCDU, MCDL, and MCDS0 to MCDS3 in the block BLK are commonly connected to the dummy word lines WLDD0 to WLDD3, WLDU, WLDL, and WLDS0 to WLDS3 respectively. In the following description, a word line out of the word lines WL0 to WL159 is represented by a word line WL unless it is limited to any of these. A dummy word line out of the dummy word lines WLDD0 to WLDD3, WLDU, WLDL, and WLDS0 to WLDS3 is represented by a dummy word line WLD unless it is limited to any of these.

The word lines WL0 to WL159 and the dummy word lines WLDD0 to WLDD3, WLDU, WLDL, and WLDS0 to WLDS3 are connected to the row decoder 12 and are each controlled independently.

Gates of the plurality of select transistors STT1a to STT1c in the string unit SU are commonly connected to one select gate line corresponding to the string unit SU and gates of the plurality of select transistors ST1a to ST1c in the string unit SU are commonly connected to one select gate line corresponding to the string unit SU. Specifically, the gates of the plurality of select transistors STT1a to STT1c in the string units SU0 are commonly connected to select gate lines SGDT0a to SGDT0c respectively. The gates of the plurality of select transistors ST1a to ST1c in the string unit SU0 are commonly connected to select gate lines SGD0a to SGD0c respectively. Then, the select gate lines SGDT0a to SGDT0c are commonly connected to a select gate line SGDT0. The select gate lines SGD0a to SGD0c are commonly connected to a select gate line SGD0.

Similarly, the gates of the plurality of select transistors STT1a to STT1c in the not-illustrated string unit SU1 are commonly connected to select gate lines SGDT1a to SGDT1c respectively. The gates of the plurality of select transistors ST1a to ST1c in the string unit SU1 are commonly connected to select gate lines SGD1a to SGD1c respectively. Then, the select gate lines SGDT1a to SGDT1c are commonly connected to a select gate line SGDT1. The select gate lines SGD1a to SGD1c are commonly connected to a select gate line SGD1. Hereinafter, lines corresponding to the select gate lines SGDT0 and SGD0 of the string unit SU0 are represented by select gate lines SGDT and SGD respectively unless a corresponding string unit is limited to any of the string units SU.

The select gate lines SGDT0 and SGD0 are connected to the row decoder 12 and are each controlled independently. This is also the same in the other string units SU1 to SU3. Therefore, the row decoder 12 is capable of applying different voltages to the select gate lines SGDT and SGD of each of the string units SU. For example, the row decoder 12 may control the select gate lines SGDT0a to SGDT0c independently from SGD0a to SGD0c of the string unit SU0, for instance. This is also the same in the other string units SU.

Gates of the plurality of select transistors STB2a to STB2d in the block BLK are commonly connected to one select gate line SGSB. Similarly, gates of the plurality of select transistors ST2a to ST2c in the block BLK are commonly connected to one select gate line SGS. Specifically, the gates of the plurality of select transistors STB2a to STB2d in the string unit SU0 are commonly connected to select gate lines SGSB0a to SGSB0d respectively. The gates of the plurality of select transistors ST2a to ST2c in the string unit SU0 are commonly connected to select gate lines SGS0a to SGS0c respectively. Then, the select gate lines SGSB0a to SGSB0d are commonly connected to the select gate line SGSB. The select gate lines SGS0a to SGS0c are commonly connected to the select gate line SGS. This is also the same in the other string units SU. Note that different select gate lines SGSB and SGS may be provided for the respective string units SU.

The select gate lines SGSB and SGS are connected to the row decoder 12 and are each independently controlled. Therefore, the row decoder 12 is capable of applying different voltages to the select gate lines SGSB and SGS. For example, the row decoder 12 may control the select gate lines SGSB0a to SGSB0d independently from SGS0a to SGS0c of the string unit SU0. This is also the same in the other string units SU.

Drains of the select transistors STT1a of the plurality of NAND strings NS in the string unit SU are connected to different bit lines BL0 to BLn (n is an integer of 1 or more) respectively. Hereinafter, a bit line out of the bit lines BL0 to BLn is represented by a bit line BL unless it is limited to any of these. The bit lines BL are connected to the sense amplifier 13 and are each independently controllable.

Sources of the plurality of select transistors STB2a in the block BLK are commonly connected to the source line SL. That is, the NAND string NS connects the bit lines BL and the source line SL.

That is, the string unit SU is a collection of the NAND strings NS connected to the different bit lines BL and connected to the same select gate lines SGDT and SGD. Further, the block BLK is a collection of the plurality of string units SU sharing the word lines WL. The memory cell array 11 is a collection of the plurality of blocks BLK sharing the bit lines BL.

In the semiconductor memory device of this embodiment, the sub blocks share the plurality of bit lines BL, the plurality of NAND strings NS, and the source line SL as the series current paths. That is, the lower sub block LSBLK and the upper sub block USBLK share the bit lines BL, the NAND strings NS, and the source line SL.

A write operation and a read operation are executed in bulk to/from the plurality of memory cell transistors MC connected to one of the word lines WL in one of the string units SU. Hereinafter, a group of the memory cell transistors MC selected in bulk at the time of the write operation and the read operation will be referred to as a "cell unit CU". A collection of one-bit data written to or read from the single cell unit CU will be referred to as a "page".

Operation of First Embodiment

Figure 4:
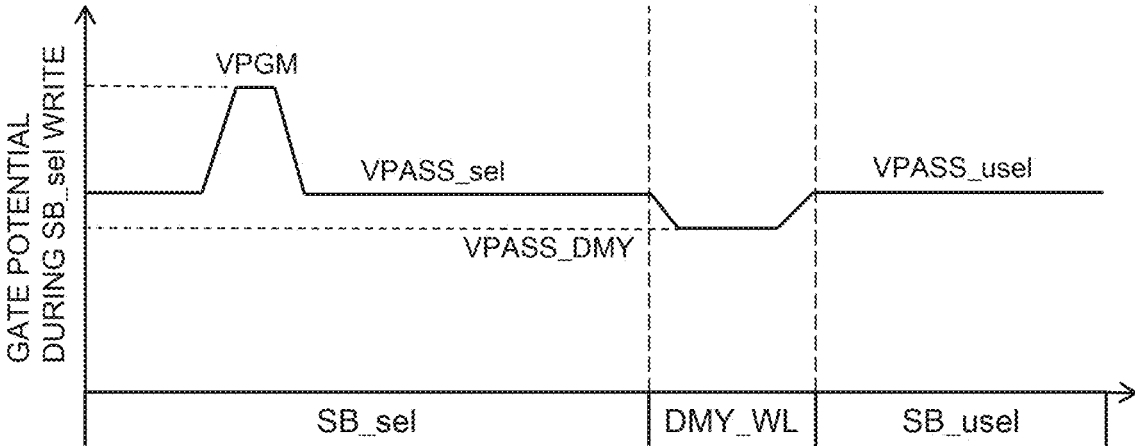
FIG. 4 is a chart illustrating an example of the levels of gate potentials during write in the semiconductor memory device according to the first embodiment.
Figure 5:
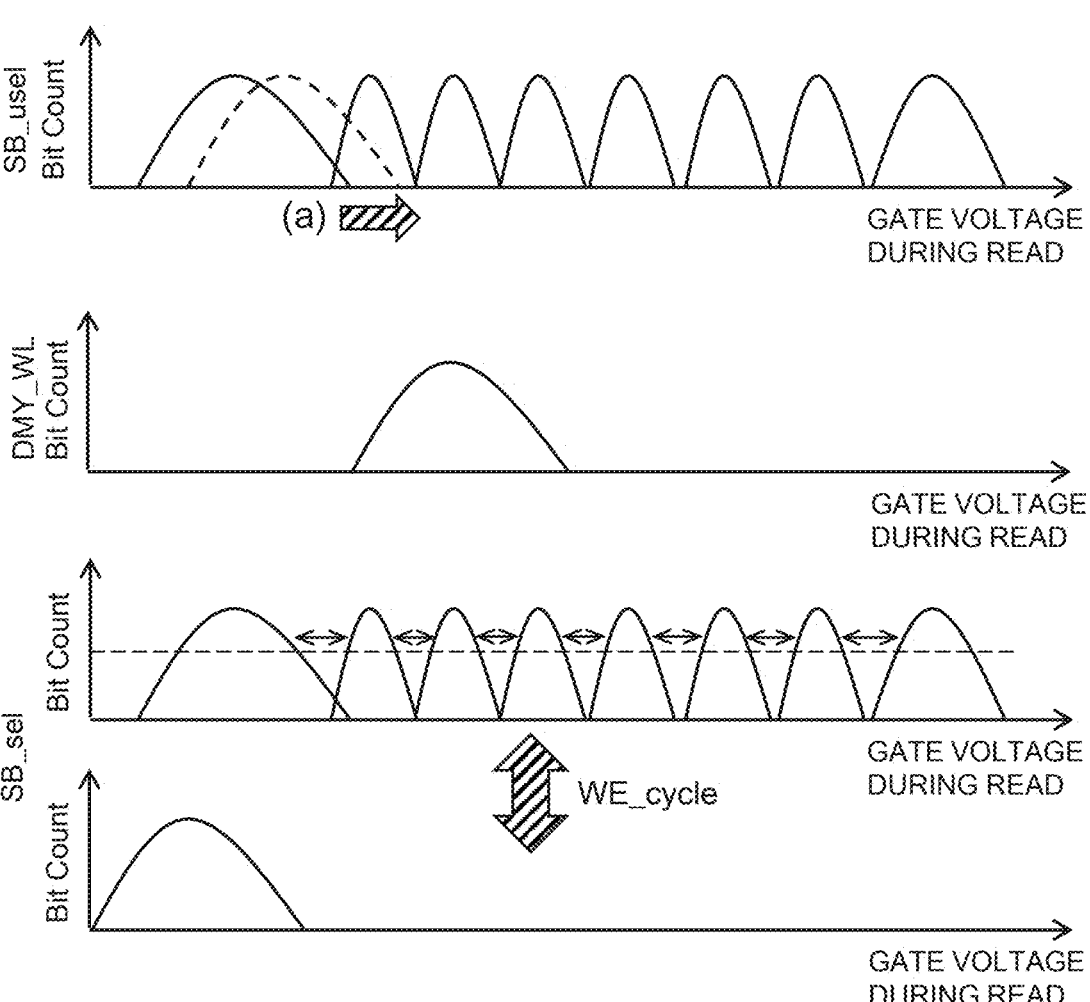
FIG. 5 is a chart illustrating an example of bit counts to explain a state of a miswrite to an unselected sub block in a semiconductor memory device.
Figure 6:
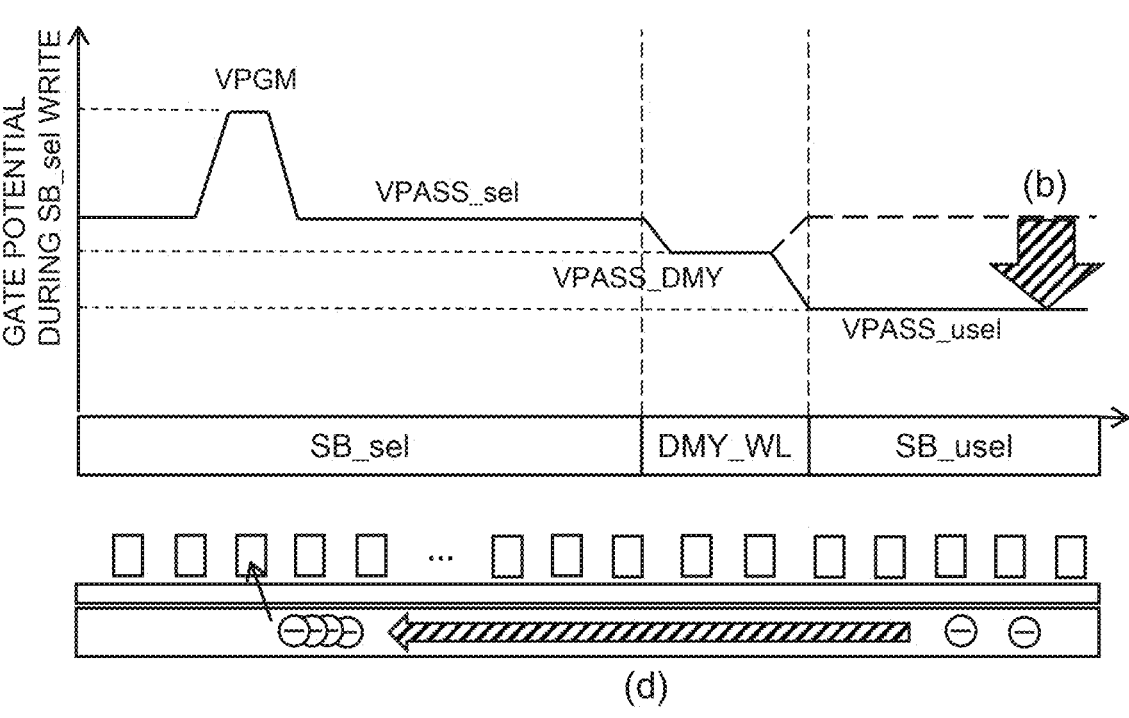
FIG. 6 is a chart illustrating an example of the levels of gate potentials during write to explain a state where a miswrite to an unselected sub block is inhibited in the semiconductor memory device according to the first embodiment.
Figure 7:
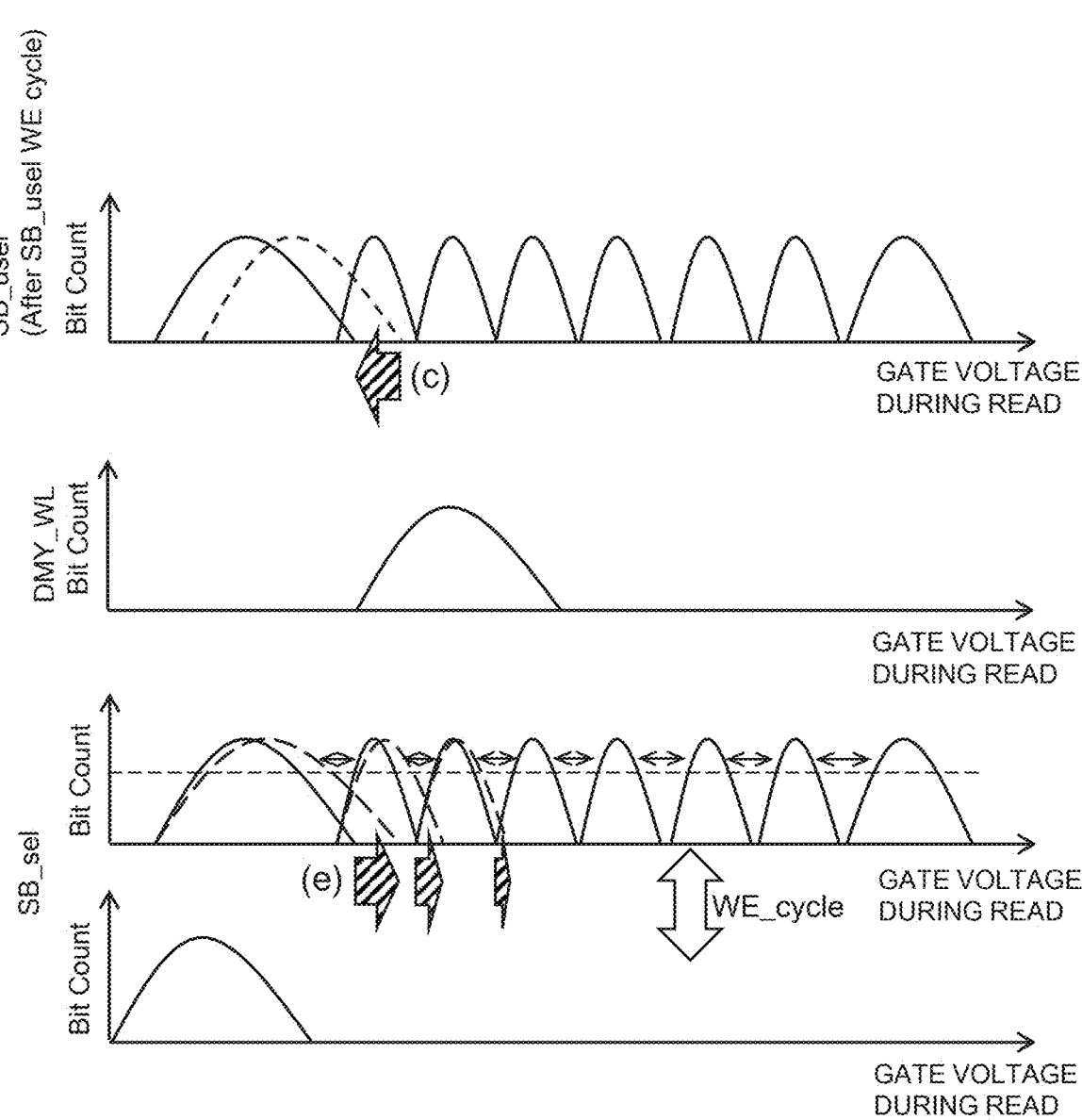
FIG. 7 is a chart illustrating an example of bit counts to explain the state where the miswrite to the unselected sub block is inhibited in the semiconductor memory device according to the first embodiment.
Figure 8:
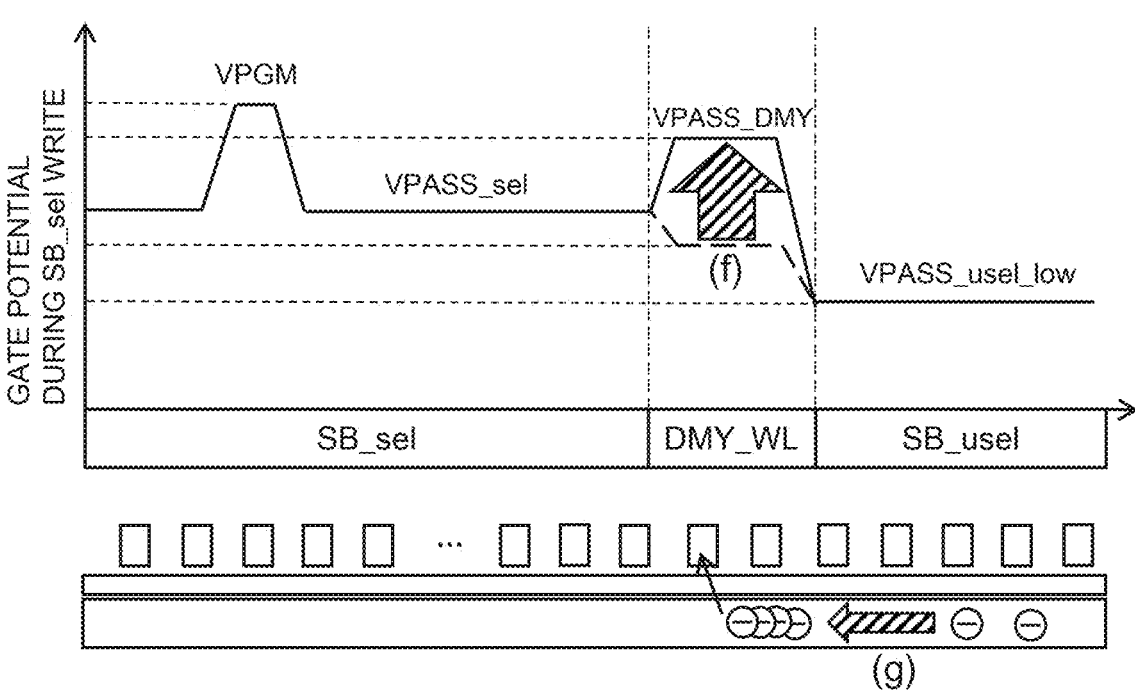
FIG. 8 is a chart illustrating an example of the levels of gate potentials during write to explain a state where SSI is inhibited in the semiconductor memory device according to the first embodiment.
Figure 9:
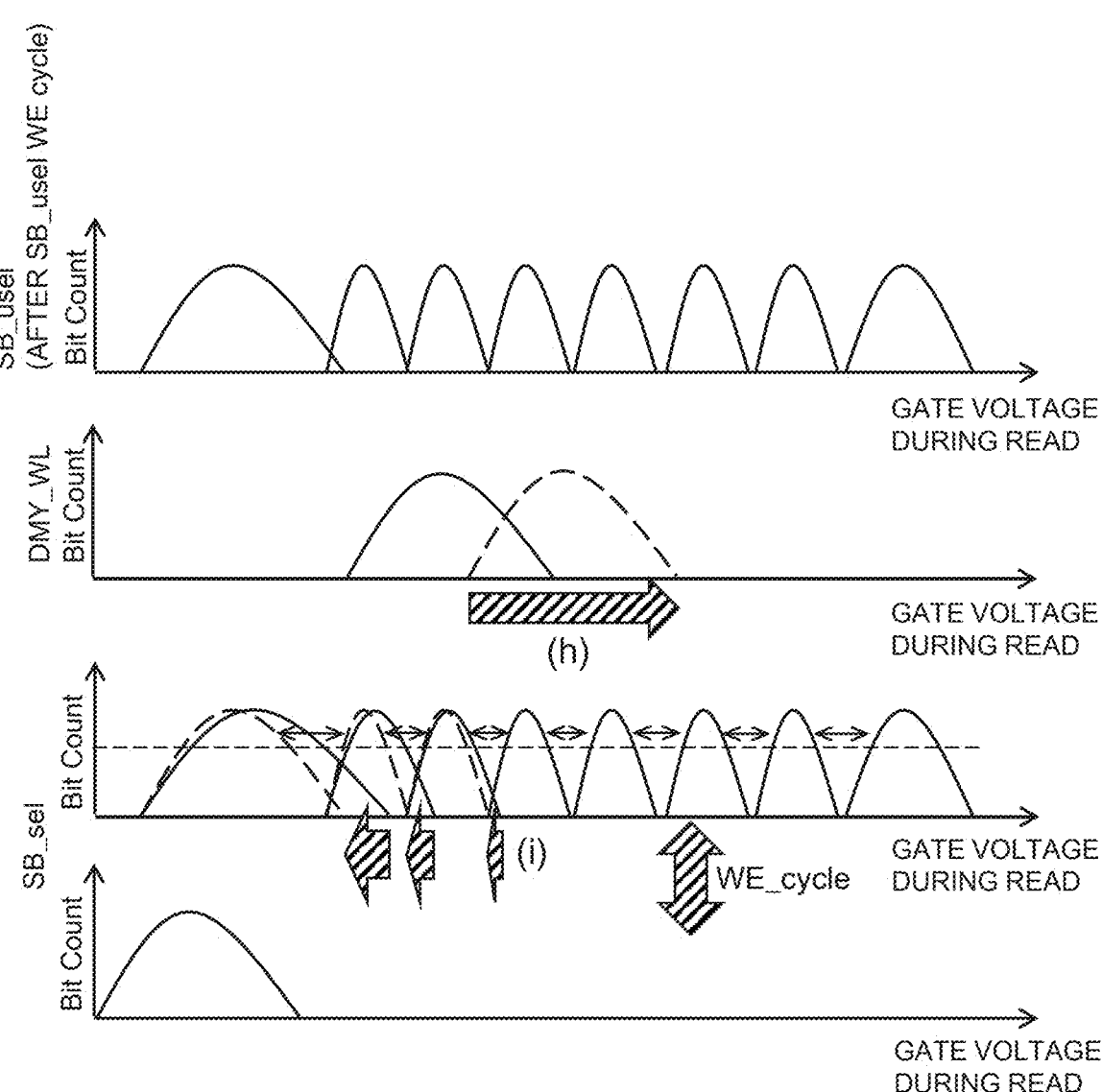
FIG. 9 is a chart illustrating an example of bit counts to explain the state where SSI is inhibited in the semiconductor memory device according to the first embodiment.

Subsequently, the operation of the semiconductor memory device according to the first embodiment will be described with reference to FIG. 3 to FIG. 9. FIG. 3 is a flowchart illustrating an example of the operation of the semiconductor memory device according to the first embodiment. FIG. 4 is a chart illustrating an example of the levels of gate potentials during write in the semiconductor memory device according to the first embodiment. FIG. 5 is a chart illustrating an example of bit counts to explain a state of a miswrite to an unselected sub block in a semiconductor memory device. FIG. 6 is a chart illustrating an example of the levels of gate potentials during write to explain a state where a miswrite to an unselected sub block is inhibited in the semiconductor memory device according to the first embodiment. FIG. 7 is a chart illustrating an example of bit counts to explain the state where the miswrite to the unselected sub block is inhibited in the semiconductor memory device according to the first embodiment. FIG. 8 is a chart illustrating an example of the levels of gate potentials during write to explain a state where SSI is inhibited in the semiconductor memory device according to the first embodiment. FIG. 9 is a chart illustrating an example of bit counts to explain the state where SSI is inhibited in the semiconductor memory device according to the first embodiment.

Upon receiving a program command, the sequencer 21 instructs the row decoder 12 and the voltage generating circuit 22 regarding the program to a prescribed address (S100).

The voltage generating circuit 22 generates a program voltage VPGM, a selected sub block voltage $V_{PASS\_sel}$, an unselected sub block voltage $V_{PASS\_usel}$, and a dummy word line voltage $V_{PASS\_DMY}$ that are to be supplied to the memory cell array 11 (S110).

The program voltage VPGM is a voltage to be applied to a word line WL corresponding to the program command. The program voltage VPGM is, for example, 20 V.

The selected sub block voltage $V_{PASS\_sel}$ is a voltage to be applied to word lines WL belonging to a selected sub block and not involved in the program command. As the selected sub block voltage $V_{PASS\_sel}$, a voltage (for example, about 10 V) that turns on the memory transistor and does not as raise a threshold voltage is selected.

The unselected sub block voltage $V_{PASS\_usel}$ is a voltage to be applied to word lines WL in an unselected sub block. As the unselected sub block voltage $V_{PASS\_usel}$, a voltage that does not raise the threshold voltage is selected.

The dummy word line voltage $V_{PASS\_DMY}$ is a voltage to be applied to dummy word lines WLD (in the example illustrated in FIG. 2, the dummy word line WLDU and the dummy word line WLDL) located between the selected sub block SB_sel and the unselected sub block SB_usel. As the dummy word line voltage $V_{PASS\_DMY}$, a voltage lower than the selected sub block voltage $V_{PASS\_sel}$ is usually selected.

Let us assume here that the unselected sub block voltage $V_{PASS\_usel}$ is about equal to the selected sub block voltage $V_{PASS\_sel}$ as illustrated in FIG. 4. As illustrated in FIG. 5, if erase and write from/to the selected sub block SB_sel are repeated ("WE_cycle" in FIG. 5) while data in the unselected sub block SB_usel is retained, a miswrite to the unselected sub block SB_usel occurs due to the unselected sub block voltage $V_{PASS\_usel}$ and electric charges accumulate therein. In FIG. 5, a state where a gate voltage in the unselected sub block SB_usel during read rises is illustrated ("(a)" in FIG. 5). This degrades the reliability of the read of the data stored in the unselected sub block SB_usel.

Therefore, as illustrated in FIG. 6, the voltage generating circuit 22 sets the unselected sub block voltage $V_{PASS\_usel}$ to a voltage lower than the selected sub block voltage $V_{PASS\_sel}$ ("(b)" in FIG. 6). This makes it possible to inhibit the miswrite to the unselected sub block SB_usel due to the unselected sub block voltage $V_{PASS\_usel}$. FIG. 7 illustrates a state where the increase in the gate voltage of the unselected sub block SB_usel during the read is inhibited ("(c)" in FIG. 7).

On the other hand, if the unselected sub block voltage $V_{PASS\_usel}$ is set to the voltage lower than the selected sub block voltage $V_{PASS\_sel}$ as illustrated in FIG. 6, a potential difference between the program voltage VPGM and the unselected sub block voltage $V_{PASS\_usel}$ can cause a phenomenon that electrons in the unselected sub block SB_usel rush into the selected sub block SB_sel (Source Side Injection: SSI). This is the unintentional injection of excessive electrons to the selected sub block SB_sel as illustrated in (d) of FIG. 6.

The injection of the electrons in the unselected sub block SB_usel to the selected sub block SB_sel due to SSI raises the gate voltage of the selected sub block SB_sel during the read as illustrated in (e) of FIG. 7. That is, the overlapping of the bit count distribution curves in the selected sub block SB_sel increases, which degrades the distribution of write to the selected sub block SB_sel.

Therefore, as illustrated in (f) of FIG. 8, the voltage generating circuit 22 sets the dummy word line voltage $V_{PASS\_DMY}$ to a voltage higher than the selected sub block voltage $V_{PASS\_sel}$ and lower than the program voltage VPGM. Owing to the setting of such a voltage configuration, the electrons in the unselected sub block SB_usel are captured by the dummy word lines WLD, making it possible to inhibit SSI ("(g)" in FIG. 8).

As a result, as illustrated in (h) of FIG. 9, the gate voltage of the dummy word lines WLD during the read rises, but as illustrated in (i) of FIG. 9, the rise in the gate voltage of the selected sub block SB_sel during the read is inhibited. That is, the overlapping of the bit count distribution curves in the selected sub block SB_sel is reduced, making it possible to inhibit the degradation of the distribution of the write to the selected sub block SB_sel.

The row decoder 12 applies, to the memory cell array 11, the program voltage VPGM, the selected sub block voltage $V_{PASS\_sel}$, the unselected sub block voltage $V_{PASS\_usel}$, and the dummy word line voltage $V_{PASS\_DMY}$ which are set by the voltage generating circuit 22 (S120).

As described above, according to the semiconductor memory device according to the first embodiment, owing to the lowering of the unselected sub block voltage $V_{PASS\_usel}$ in the unselected sub block SB_usel, it is possible to inhibit a miswrite in the unselected sub block SB_usel. In addition, according to the semiconductor memory device according to the first embodiment, owing to the setting of the dummy word line voltage $V_{PASS\_DMY}$ applied to the dummy word lines WLD higher than the voltage applied to the peripheral word lines WL, it is possible to inhibit SSI to the selected sub block SB_sel to prevent the degradation of the write distribution.

Second Embodiment

Figure 10:
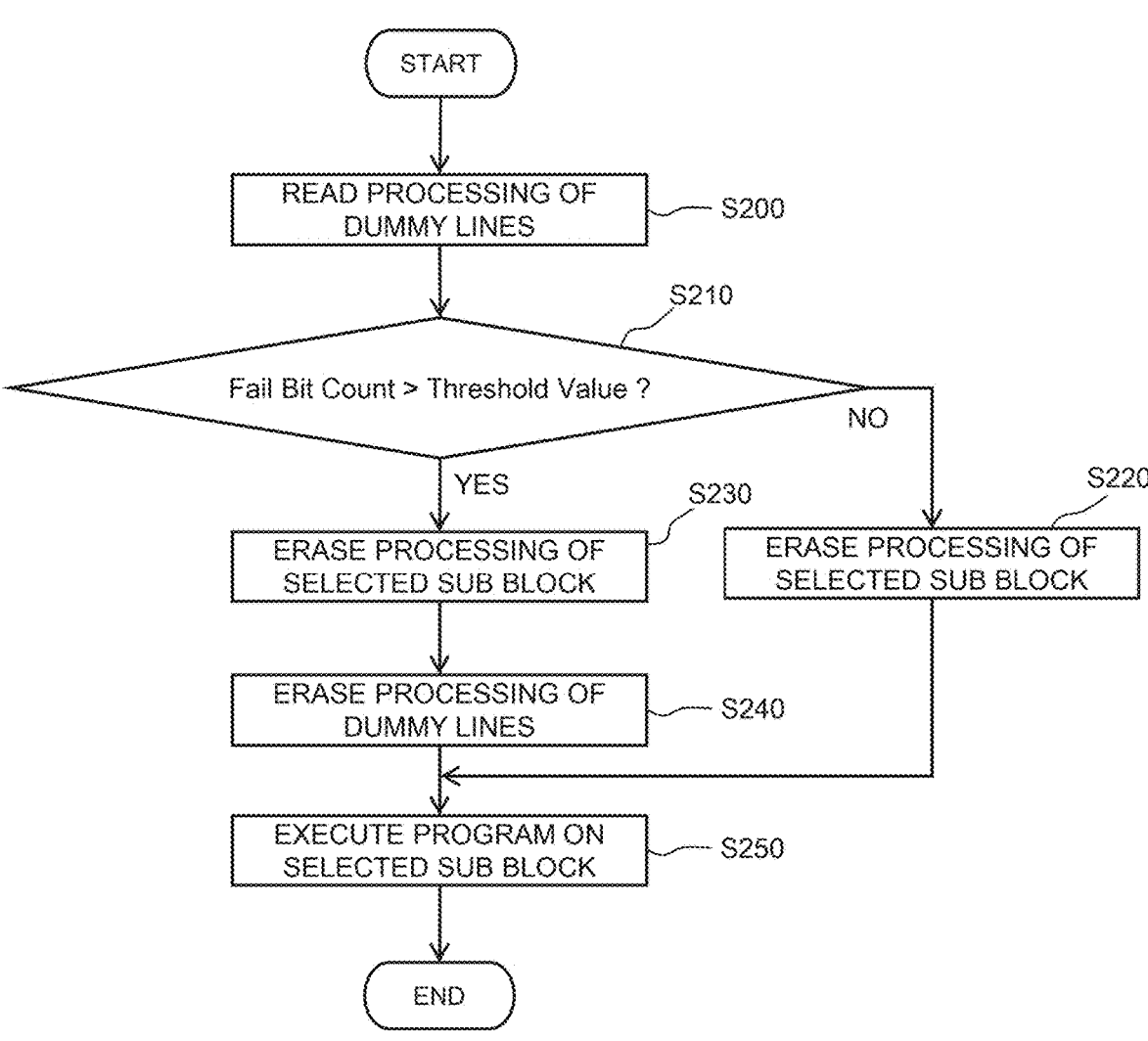
FIG. 10 is a flowchart illustrating an example of an erase operation of a semiconductor memory device according to a second embodiment.
Figure 11:
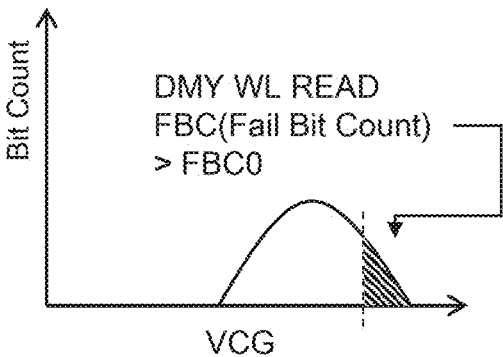
FIG. 11 is a chart illustrating an example of a bit count to explain the operation of the semiconductor memory device according to the second embodiment.
Figure 12:
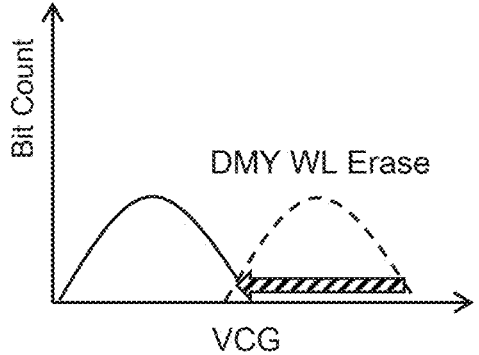
FIG. 12 is a chart illustrating an example of the bit count to explain the operation of the semiconductor memory device according to the second embodiment.
Figure 13:
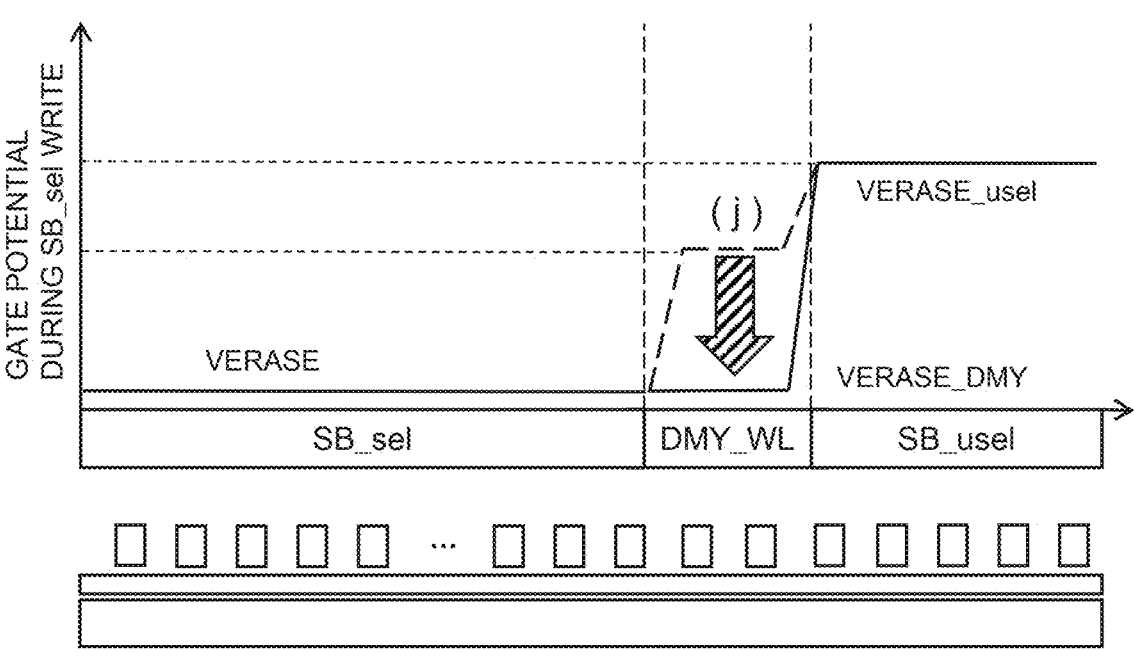
FIG. 13 is a chart to explain an example of the levels of gate potentials during the erase in the semiconductor memory device according to the second embodiment.
Figure 14:
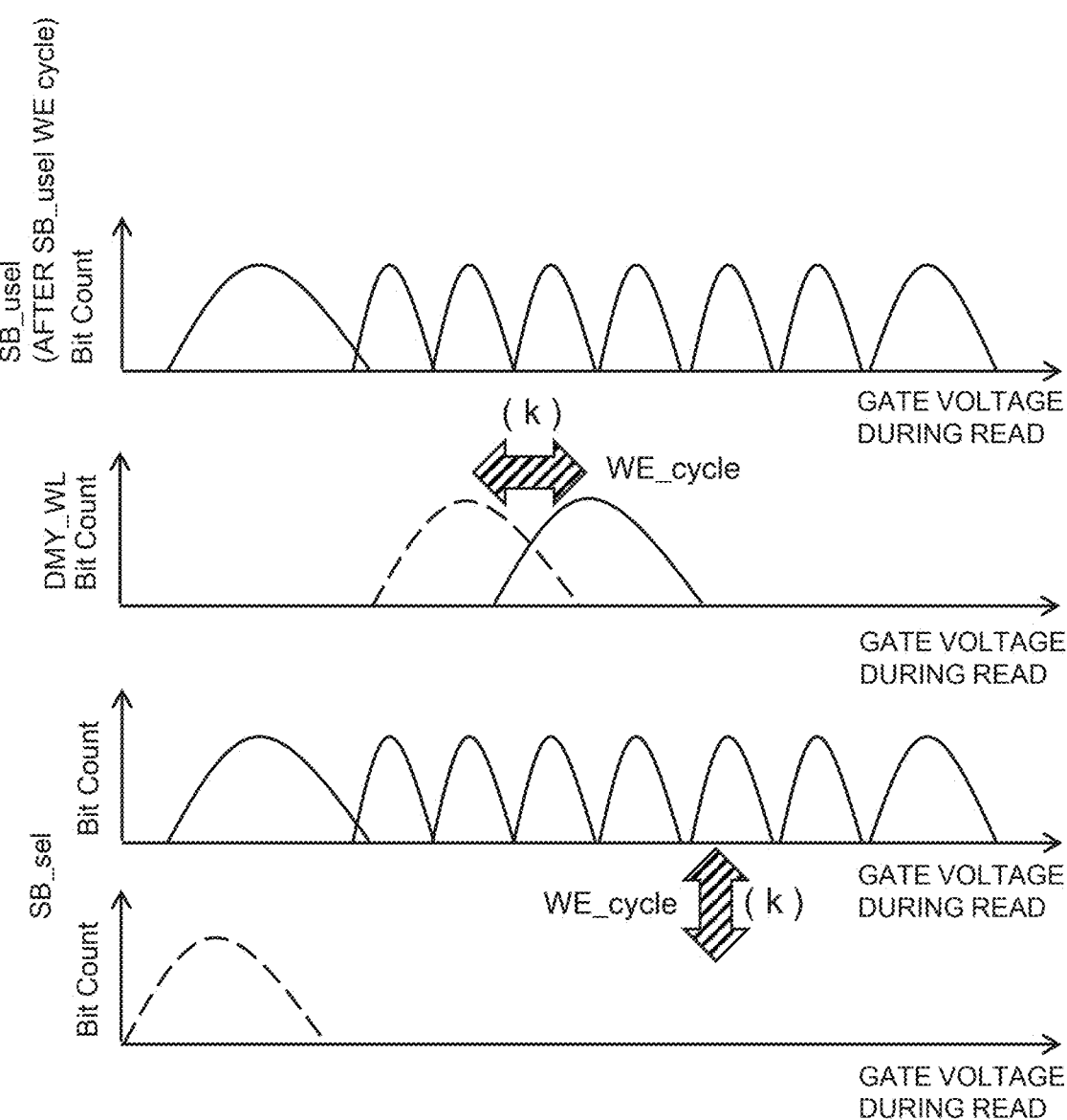
FIG. 14 is a chart illustrating an example of bit counts during the erase in the semiconductor memory device according to the second embodiment.

Subsequently, a semiconductor memory device according to a second embodiment will be described in detail. This embodiment relates to an erase operation of the dummy word lines WLD in the semiconductor memory device of the first embodiment. In the description below, constituent elements having substantially the same function and configuration will be denoted by the same reference sign, and a redundant description thereof will be omitted. FIG. 10 is a flowchart illustrating an example of the erase operation of the semiconductor memory device according to the second embodiment. FIG. 11 is a chart illustrating an example of a bit count to explain the operation of the semiconductor memory device according to the second embodiment. FIG. 12 is chart illustrating an example of the bit count to explain the operation of the semiconductor memory device according to the second embodiment. FIG. 13 is a chart to explain an example of the levels of gate potentials during the erase in the semiconductor memory device according to the second embodiment. FIG. 14 is a chart illustrating an example of bit counts during the erase in the semiconductor memory device according to the second embodiment.

In the semiconductor memory device according to the first embodiment, the dummy word line voltage $V_{PASS\_DMY}$ to be applied to the dummy word lines WLD is set higher than the voltage to be applied to the peripheral word lines WL, thereby inhibiting SSI to the selected sub block SB_sel. However, the dummy word lines WLD absorb the electrons from the unselected sub block SB_usel, resulting in a rise in the gate voltage of the dummy word lines WLD during read to reduce the effect of preventing the degradation of the write distribution.

Therefore, in the semiconductor memory device of this embodiment, at the time of erase (Erase) processing of the selected sub block SB_sel, erase processing of the dummy word lines WLD is also executed. More specifically, in the case where the erase processing of the selected sub block SB_sel is to be executed, read processing of the dummy word lines WLD is executed, and when the count of fail bits (Fail Bit Count) exceeds a predetermined threshold value, the erase processing of the dummy word lines WLD is executed.

The sequencer 21 executes the read processing of the dummy word lines WLD (in the example illustrated in FIG. 2, the dummy word line WLDU and the dummy word line WLDL) (S200). The sense amplifier 13 reads data corresponding to the dummy word lines WLDU and the dummy word line WLDL based on an instruction signal from the sequencer 21.

The sequencer 21 determines whether or not the fail bit count in the dummy word lines WLD is over the predetermined threshold value (S210). FIG. 11 illustrates an example of the bit count in the dummy word lines WLD. When electrons accumulate in the dummy word lines WLD, the distribution of the bit count shifts toward a high potential side. As a result, the fail bit count increases, and the bit count includes a certain number of the fail bits or more (the hatched part in FIG. 11).

If the fail bit count in the dummy word lines WLD is not over the predetermined threshold value (NO in S210), the sequencer 21 executes the erase of the selected sub block SB_sel (S220).

If the fail bit count in the dummy word lines WLD is over the predetermined threshold value (YES in S210), the sequencer 21 executes the erase processing of the selected sub block SB_sel (S230). Further, the sequencer 21 executes the erase processing of the dummy word line WLDU and the dummy word line WLDL (S240). FIG. 12 illustrates a state where the erase processing of the dummy word lines WLD (the dummy word line WLDU and the dummy word line WLDL) has been executed. As a result of the execution of the erase processing of the dummy word lines WLD, the distribution of the bit count shifts toward a low potential side.

FIG. 13 illustrates a state of the gate potentials after the execution of the erase processing of the selected sub block SB_sel. The gate potential of the selected sub block SB_sel has decreased to $V_{ERASE}$ as a result of the erase processing. Further, the gate potential of the dummy word lines WLD has also decreased to $V_{ERASE\_DMY}$ (("j") in FIG. 13) as a result of the erase processing. On the other hand, the gate potential $V_{ERASE\_usel}$ of the unselected sub block SB_usel is kept high.

The sequencer 21 continues to execute the program on the selected sub block SB_sel based on the received program command (S250).

Through the above-described processing, the erase processing of the dummy word lines WLD is executed together ("(k)" in FIG. 14) when the erase processing of the selected sub block SB_sel is executed. As a result, it is possible to recover the dummy word lines WLD which are damaged sacrificial layers.

The embodiments are presented by way of example only and the scope of the invention are not limited by these.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including
   a plurality of bit lines,
   a source line,
   a plurality of NAND strings each having a plurality of serially connected memory cell transistors and connecting the plurality of bit lines and the source line,
   a first sub block and a second sub block different from the first sub block, the first and second sub blocks sharing the plurality of bit lines, the plurality of NAND strings, and the source line as series current paths,
   a first word line group included in the first sub block,
   a second word line group included in the second sub block, and
   a dummy word line located between the first sub block and the second sub block; and
a control circuit capable of applying predetermined voltages to the first word line group, the second word line group, and the dummy word line, wherein, when selecting a specific word line belonging to the first word line group to execute a write operation, the control circuit applies, to the dummy word line, a voltage higher than a voltage applied to an unselected word line belonging to the first word line group and a voltage applied to the second word line group.

2. The semiconductor memory device according to claim 1, wherein the first word line group is a word line group adjacent to the second word line group.

3. The semiconductor memory device according to claim 1, wherein, when selecting the specific word line belonging to the first word line group to execute the write operation, the control circuit applies, to the second word line group, a voltage lower than the voltage applied to the unselected word line belonging to the first word line group.

4. The semiconductor memory device according to claim 1, wherein the control circuit executes an erase operation of the dummy word line when executing an erase operation of the first sub block.

5. The semiconductor memory device according to claim 4, wherein the control circuit executes read processing of the dummy word line at a predetermined instant, and based on a result of the read from the dummy word line, executes the erase operation of the dummy word line when executing the erase operation of the first sub block.

* * * * *